(12) United States Patent
Byun

(10) Patent No.: US 9,799,604 B2
(45) Date of Patent: Oct. 24, 2017

(54) SEMICONDUCTOR DEVICE HAVING STRUCTURE FOR IMPROVING VOLTAGE DROP AND DEVICE INCLUDING THE SAME

(71) Applicant: SAMSUNG ELECTRONICS CO., LTD., Suwon-si, Gyeonggi-do (KR)

(72) Inventor: Sung Su Byun, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/208,639

(22) Filed: Jul. 13, 2016

(65) Prior Publication Data

US 2017/0018504 A1    Jan. 19, 2017

(30) Foreign Application Priority Data

Jul. 16, 2015  (KR) .................. 10-2015-0101007

(51) Int. Cl.
| | | |
|---|---|---|
| H01L 23/528 | (2006.01) | |
| H01L 23/522 | (2006.01) | |
| H01L 23/532 | (2006.01) | |
| H01L 21/02 | (2006.01) | |

(52) U.S. Cl.
CPC ...... *H01L 23/5286* (2013.01); *H01L 23/5226* (2013.01); *H01L 21/02697* (2013.01); *H01L 23/528* (2013.01); *H01L 23/5283* (2013.01); *H01L 23/5329* (2013.01)

(58) Field of Classification Search
CPC .............. H01L 23/5286; H01L 23/5226; H01L 21/02697; H01L 23/5384; H01L 23/528; H01L 23/5283
See application file for complete search history.

(56) References Cited

U.S. PATENT DOCUMENTS

| | | |
|---|---|---|
| 6,306,745 B1 | 10/2001 | Chen |
| 6,388,332 B1 | 5/2002 | Aggarwal et al. |
| 6,581,201 B2 | 6/2003 | Cano et al. |
| 6,925,627 B1 | 8/2005 | Longway et al. |
| 7,076,756 B2 | 7/2006 | Ichimiya |
| 7,161,823 B2 | 1/2007 | Lee et al. |
| 8,174,052 B2 | 5/2012 | Kim et al. |
| 8,336,018 B2 | 12/2012 | Turner et al. |
| 8,495,547 B2 | 7/2013 | Keinert et al. |
| 8,513,978 B2 | 8/2013 | Sherlekar |
| 9,026,977 B2 | 5/2015 | Tarabbia et al. |

(Continued)

FOREIGN PATENT DOCUMENTS

| | | |
|---|---|---|
| KR | 2003-0078462 A | 10/2003 |
| KR | 2014-0021252 A | 2/2014 |

*Primary Examiner* — Nathan W Ha
(74) *Attorney, Agent, or Firm* — Volentine & Whitt, PLLC

(57) ABSTRACT

A semiconductor device includes a semiconductor substrate and a plurality of metal layers above the semiconductor substrate. A first of the metal layers includes a plurality of first power rails which extend in a first direction and provide a first voltage, a plurality of second power rails which extend in the first direction and provide a second voltage, and a first conductor which is integral with one end of each of the first power rails and extends in a second direction. The first direction is perpendicular to the second direction. The first voltage is one of a ground voltage and a power source voltage and the second voltage is the other voltage.

20 Claims, 8 Drawing Sheets

(56) References Cited

U.S. PATENT DOCUMENTS

| | | | |
|---|---|---|---|
| 2006/0022352 A1* | 2/2006 | Moore | H01L 24/03 257/786 |
| 2010/0148219 A1* | 6/2010 | Shimizu | H01L 27/0207 257/207 |
| 2012/0176193 A1* | 7/2012 | Chiang | H01L 23/4824 327/566 |
| 2013/0221538 A1* | 8/2013 | Funane | H01L 23/481 257/774 |
| 2013/0285258 A1* | 10/2013 | Nagase | H01L 23/5221 257/776 |
| 2014/0110787 A1* | 4/2014 | Wen | H01L 27/088 257/368 |
| 2014/0210100 A1* | 7/2014 | Xiao | H01L 23/481 257/774 |
| 2014/0252650 A1* | 9/2014 | Utsumi | H01L 23/5286 257/774 |
| 2015/0085579 A1* | 3/2015 | Chen | H01L 27/1157 365/185.17 |
| 2015/0380365 A1* | 12/2015 | Dyka | H01L 27/0292 257/774 |

* cited by examiner

US 9,799,604 B2

SEMICONDUCTOR DEVICE HAVING STRUCTURE FOR IMPROVING VOLTAGE DROP AND DEVICE INCLUDING THE SAME

PRIORITY STATEMENT

This application claims priority under 35 U.S.C. §119(a) from Korean Patent Application No. 10-2015-0101007 filed on Jul. 16, 2015, the disclosure of which is hereby incorporated by reference in its entirety.

BACKGROUND

The inventive concept relates to semiconductor devices. More particularly, the inventive concept relates to semiconductor devices having a conductive strip, namely, a power rail, by which a voltage source is connected to electronic elements of the device.

An electronic device such as a memory device, an integrated circuit, a smartphone, or a tablet personal computer (PC) includes a power rail along which operating voltages, provided by a voltage source, are supplied to electronic elements (e.g., transistors, memory cells, and flip-flops) of the electronic device, respectively. The stable supply of the operating voltages is essential to the reliability of the electronic device. In particular, an instantaneous drop in an operating voltage of an electronic element may cause the electronic element to malfunction. Voltage drop refers to the amount by which energy, supplied by a voltage source to an electrical circuit, is reduced by the passive elements of the circuit.

When a voltage source is connected to active or "electronic" elements of a circuit through a common conductive path such as that provided by power rails, the voltage (a first voltage) supplied to one of the electronic elements relatively close to the voltage source along the conductive path is higher than the voltage (a second voltage) supplied to another of the electronic elements further from the voltage source along the conductive path. Thus, in a case in which the voltage output from the voltage source abruptly changes, i.e., in the case of a voltage drop, a change in the second voltage may be greater than a change in the first voltage.

Accordingly, an electronic element of a circuit of an electronic device that is connected to a voltage source by a power rail and is relatively far from the voltage source along the conductive path provided by the power rail may be prone to malfunctions, or at the very least may be more prone to malfunctions than the other electronic element(s) of the circuit closer to the voltage source.

SUMMARY

According to an aspect of the inventive concept, there is provided a semiconductor device including a semiconductor substrate, and a plurality of metal layers disposed one above another on the semiconductor substrate, and in which each of at least one of the metal layers comprises a plurality of first power rails dedicated for connection to a first voltage and each of which extend longitudinally in a first direction, a plurality of second power rails dedicated for connection to a second voltage and each of which extends longitudinally in the first direction, and a first conductor which is integral with each of the first power rails at first ends of the first power rails, respectively, and spans the first power rails in a second direction.

According to another aspect of the inventive concept, there is provided a system on chip including a processor and a hardware component connected to the processor. At least one element among the processor and the hardware component includes a semiconductor substrate and a plurality of metal layers disposed above the semiconductor substrate. A first metal layer among the plurality of metal layers includes a plurality of first power rails which extend in a first direction and provide a first voltage, a plurality of second power rails which extend in the first direction and provide a second voltage, and a first conductor which is coupled to one end of each of the first power rails and extends in a second direction.

According to still another aspect of the inventive concept, there is provided a mobile device including a processor, a memory configured to communicate with the processor, and a hardware component configured to communicate with the processor. At least one element among the processor, the memory, and the hardware component includes a semiconductor substrate and a plurality of metal layers disposed above the semiconductor substrate. A first metal layer among the plurality of metal layers includes a plurality of first power rails which extend in a first direction and provide a first voltage, a plurality of second power rails which extend in the first direction and provide a second voltage, and a first conductor which is coupled to one end of each of the first power rails and extends in a second direction.

According to still another aspect of the inventive concept, there is provided a semiconductor device including a semiconductor substrate, active electronic elements disposed at an upper portion of the semiconductor substrate as arrayed in first and second directions each parallel to an upper surface of the substrate, a plurality of first power rails each of which extends longitudinally in the first direction across the array of active electronic elements, a plurality of second power rails each of which extends longitudinally in the first direction across the array of active electronic elements, a conductor that is integral with each of the first power rails at first ends of the first power rails, respectively, a third power rail disposed above the first power rails and extending across the first power rails in the second direction, and a first set of vias electrically connecting the third power rail to the first power rails. The active electronic elements are each electrically connected to a respective one of the first power rails and a respective one of the second power rails at locations in the first direction between the third power rail and the conductor.

According to still another aspect of the inventive concept, there is provided a semiconductor system including a semiconductor substrate, active electronic elements disposed at an upper portion of a first region of the semiconductor substrate as arrayed in first and second directions each parallel to an upper surface of the substrate, a hard macro disposed at an upper portion of a second region of the semiconductor substrate, metal layers disposed on the semiconductor substrate at a plurality of different levels each above the levels of the logic gates and the hard macro, a first set of vias, and a second set of vias. A first one of the metal layers comprises a plurality of first power rails each of which extends longitudinally in the first direction across the array of active electronic elements, a plurality of second power rails each of which extends longitudinally in the first direction across the array of active electronic elements, and a conductor integral with each of the first power rails at first ends of the first power rails, respectively. Another of the metal layers is disposed above the first metal layer and includes a third power rail extending across the first power rails in the second direction, and a fourth power rail extending across the second power rails in the second direction.

The first set of vias electrically connects the third power rail to the first power rails. The second set of vias electrically connects the fourth power rail to the second power rails. The array of the active electronic elements is located in the first direction between the third power rail and the conductor, and each of the active electronic elements is electrically connected to a respective one of the first power rails and a respective one of the second power rails.

BRIEF DESCRIPTION OF THE DRAWINGS

The above and other features and advantages of the inventive concept will become more apparent from the following detailed descriptions of example thereof made with reference to the attached drawings in which.

DETAILED DESCRIPTION

Figure 1:
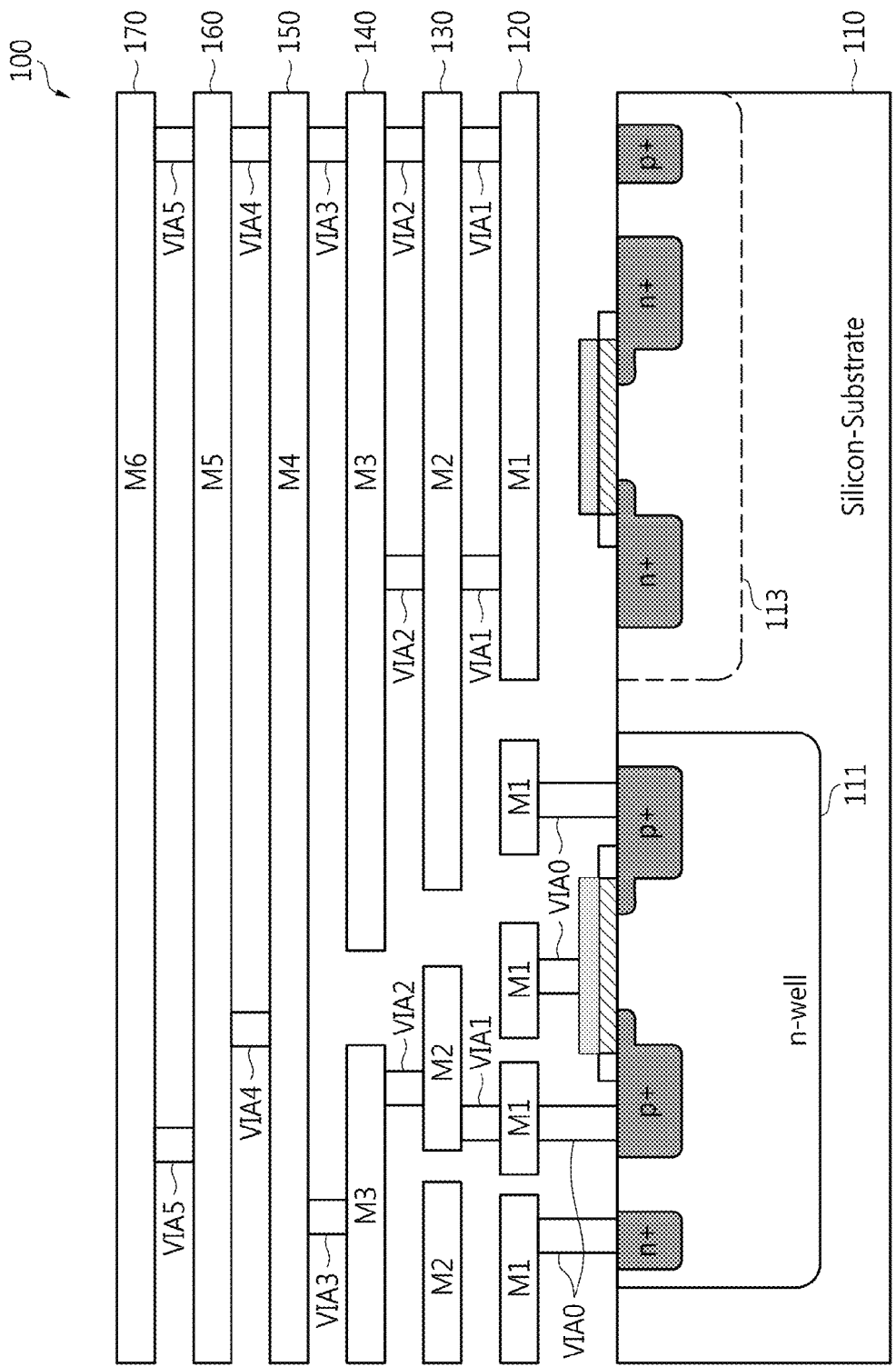
FIG. 1 is a cross-sectional view of elements of a semiconductor device.

The inventive concept now will be described more fully hereinafter with reference to the accompanying drawings, in which examples of the inventive concept are shown. This inventive concept may, however, be embodied in many different forms and should not be construed as limited to the examples disclosed herein. Rather, these examples are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the field of the inventive concept belongs. For example, the term "extending" when used in connection with an element or feature having a linear form will be understood as referencing the lengthwise or longitudinal direction of the element or feature. The term "connected" generally will refer to an electrically conductive connection as the context will make clear. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Referring to FIG. 1, a semiconductor device 100 may include a semiconductor substrate 110 and a plurality of metal interconnections disposed on the semiconductor substrate 110 one above another. For example, the semiconductor device 100 may have first through sixth metal interconnections M1 through M6 disposed one above another on the semiconductor substrate 110. The metal interconnections M1 through M6 occupy different levels in the device 100 from one another. Also, the metal interconnections M1 through M6 may be evenly spaced from one another (by insulating material such as interlayer dielectric layers) in the vertical direction, but the inventive concept is not limited to such a feature. The metal interconnections M1 through M6, as will be described in more detail later on, may each electrically connect a power voltage and a ground voltage to active electronic components of the device 100. The metal interconnections M1 through M6 may be metal layers 120 through 160, respectively.

The semiconductor device 100 may also include a plurality of sets of vias. For example, first vias VIA1 may connect the first metal interconnection or layer M1 or 120 with the second metal interconnection or layer M2 or 130. Second vias VIA2 may connect the second metal interconnect or layer M2 or 130 with the third metal interconnection or layer M3 or 140. Third vias VIA3 may connect the third metal interconnection or layer M3 or 140 with the fourth metal interconnection or layer M4 or 150. Fourth vias VIA4 may connect the fourth metal interconnection or layer M4 or 150 with the fifth metal interconnection or layer M5 or 160. Fifth vias VIA5 may connect the fifth metal interconnection or layer M5 or 160 with the sixth metal interconnection or layer M6 or 170. Vias VIA0 may connect a plurality of impurity regions with the first metal interconnection or layer M1 or 120 and/or may connect a transistor's gate (gate electrode) with the first metal interconnection or layer M1 or 120.

For the sake of simplicity, examples in which the metal interconnections M1 through M6 are metal layers 120 through 160, respectively, will be used in the detailed description that follows.

Although six metal layers 120 through 170 and six sets of vias VIA are illustrated in FIG. 1, the semiconductor device 100 may have other numbers of metal layers and corresponding sets of vias VIA.

The semiconductor substrate 110 is a silicon substrate in this example. It may be a P-type substrate or an N-type substrate. In the present example, i.e., for purposes of illustration and description only, the semiconductor substrate 110 is a P-type substrate as illustrated in FIG. 1.

A plurality of active regions 111 and 113 may be formed within the semiconductor substrate 110. Each of the active regions 111 and 113 may include at least one p+ region and/or an n+ impurity region. More specifically, each of the active regions 111 and 113 may include a plurality of n+ or a plurality of p+ impurity regions At least one transistor may be constituted by those impurity regions. That is, the impurity regions may each include at least one drain region and at least one source region. The semiconductor device 100 may also include the gate(s) of a transistor(s), a polysilicon layer, and metal contacts. Therefore, at least one memory cell may be disposed at each of the active regions 111 and 113. The memory cell may be a volatile or non-volatile memory cell.

In the case of a volatile memory cell(s), the volatile memory cell(s) may be that/those of a random access memory (RAM), dynamic RAM (DRAM), static RAM (SRAM), thyristor RAM (T-RAM), zero capacitor RAM (Z-RAM), or twin transistor RAM (TTRAM) but is not limited thereto. In the case of a non-volatile memory cell(s), the non-volatile memory cell(s) may be that/those of a read-only memory (ROM), electrically erasable programmable ROM (EEPROM), flash memory (e.g., NAND-type flash memory or NOR-type flash memory), magnetic RAM (MRAM), spin-transfer torque MRAM, ferroelectric RAM (FeRAM), phase-change RAM (PRAM), or resistive RAM (RRAM) but is not limited thereto.

Thus, the semiconductor device 100 may be a NAND-type flash memory of the type employed a smart card, a secure digital (SD) card, a micro SD card, a multimedia card (MMC), an embedded MMC (eMMC), an embedded multi-chip package (eMCP), a perfect page NAND (PPN), a universal flash storage (UFS), a solid state drive (SSD), or an embedded SSD.

In some semiconductor devices 100 of the type illustrated in FIG. 1, each of the active regions 111 and 113 has a plurality of impurity regions (such as a p+ region and an n+ region) forming or constituting a hard macro. A hard macro may consist of one or more hardware components. A volatile or non-volatile memory referred to above may be an example of a hard macro, but the inventive concept is not limited to such examples. A hard macro may also embody a logic gate, i.e., a physical element for use in executing a Boolean function.

The hardware component may be an intellectual property (IP). Here, the term hardware component or IP refers to a function block which can be used in an integrated circuit (IC), a system on chip (SoC), or an application processor (AP).

The IP (or function block) may be a central processing unit (CPU), a processor, a core of a multi-core processor, a memory device, a universal serial bus (USB), a peripheral component interconnect (PCI), a digital signal processor (DSP), a wired interface, a wireless interface, a controller, a hardware codec, a video module (such as a camera interface, a Joint Photographic Experts Group (JPEG) processor, a video processor, or a mixer, etc.), a three-dimensional (3D) graphic core, an audio system, a buffer, or a driver. The term function block as used herein refers to a circuit or a hardware module that has unique features.

In addition, the hard macro may be an analog-to-digital converter (ADC) and/or a digital-to-analog converter (DAC). The hard macro may also be a standard cell. The standard cell may be a group of an interconnect structure and a transistor structure for providing a Boolean logic function (e.g., AND, OR, NAND, XOR, XNOR, or an inverter).

Figure 2A:
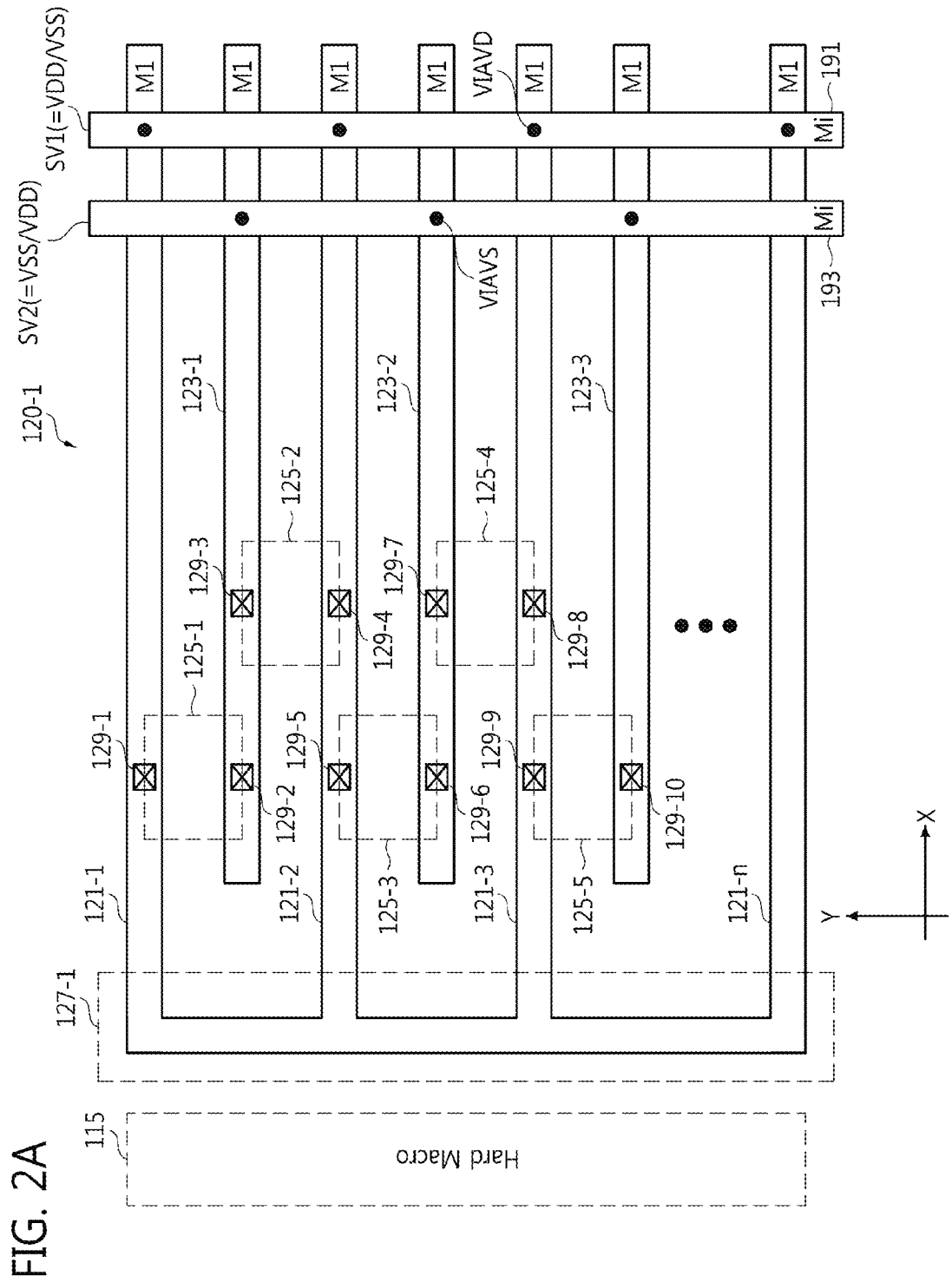
FIG. 2A is a plan view of parts of a first metal layer and an upper metal layer in one example of a semiconductor device of the type illustrated in FIG. 1, according the inventive concept.
Figure 2B:
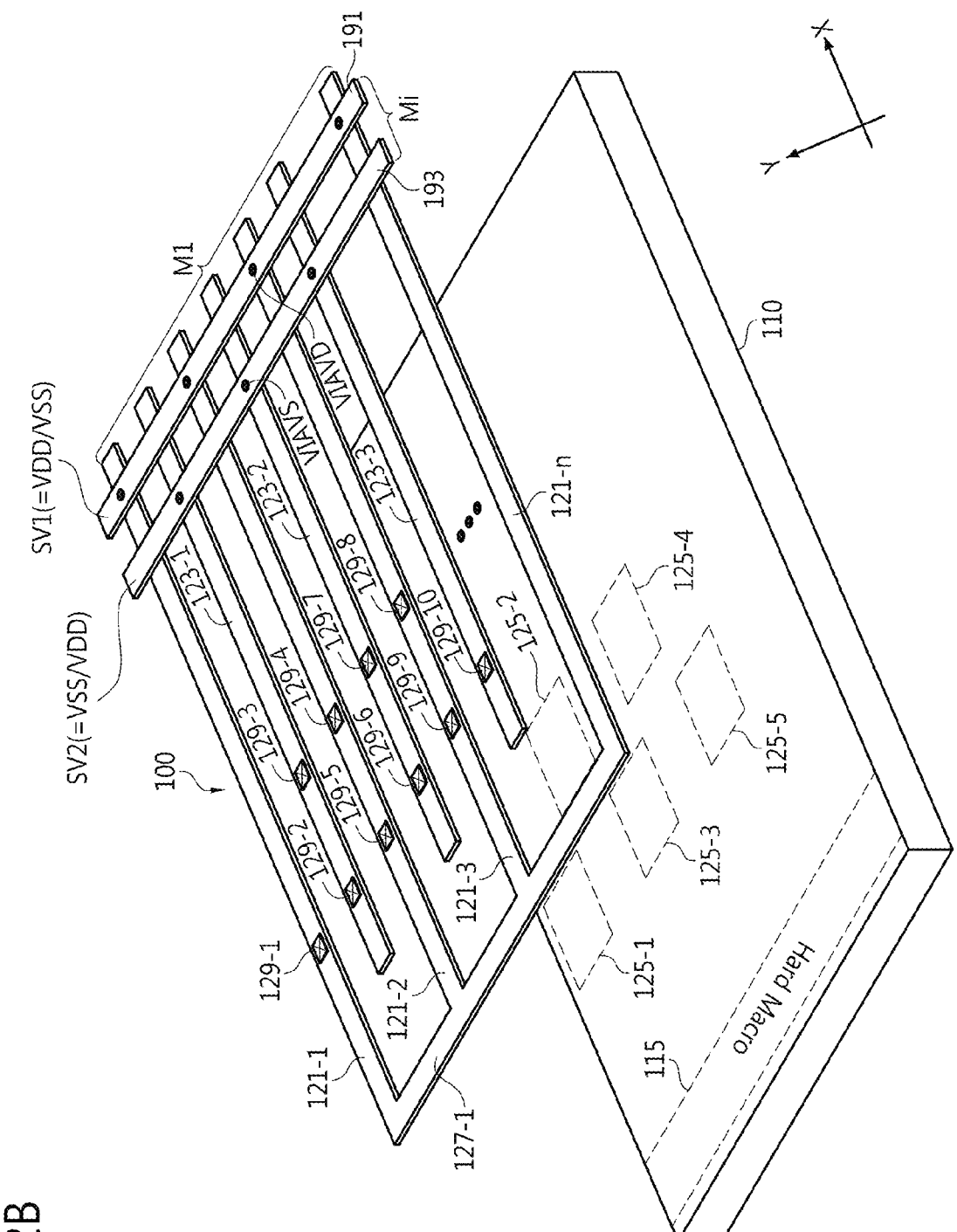
FIG. 2B is a perspective view of the parts of the first metal layer and upper metal layer shown in FIG. 2A.

FIGS. 2A and 2B illustrate an example of a semiconductor device according to the inventive concept, including that of a first metal interconnection, e.g., a first metal layer 120-1 and an upper metal layer Mi. In examples of the inventive concept illustrated by FIGS. 1 and 2A and 2B, one or more of the metal layers 120 through 160 illustrated in FIG. 1 may have a structure similar to that of the first metal layer 120-1 illustrated in FIGS. 2A and 2B.

The first metal interconnection, e.g., first metal layer 120-1, may comprise a plurality of first power rails 121-1 through 121-*n* (where "n" is a natural number of at least 4), a plurality of second power rails 123-1 through 123-3, and a first conductor 127-1. In the case in which the first metal interconnection is a metal layer, i.e., the first metal layer 120-1, the first power rails 121-1 through 121-*n*, the second power rails 123-1 through 123-3, and the first conductor 127-1 are contiguous with one another. Also, the first metal layer 120-1, the first power rails 121-1 through 121-*n*, the second power rails 123-1 through 123-3, and the first conductor 127-1 may lie in a common (horizontal) plane. In this respect, the term "plane" refers to a layer having a uniform thickness. Specifically, the first power rails 121-1 through 121-*n*, the second power rails 123-1 through 123-3, and the first conductor 127-1 have coplanar upper surfaces and coplanar lower surfaces in this example. In the following, all of the metal interconnections will be described as metal layers, respectively.

A hard macro 115 and a plurality of logic gates 125-1 through 125-5 may be disposed at an upper portion of the semiconductor substrate 110. For example, at least part of the hard macro 115 may be provided at an upper portion of the first active region 111 in the device 100 illustrated in FIG. 1 and at least part of each of the logic gates 125-1 through 125-5 may be provided at an upper portion the second active region 113. Also, the hard macro 115 may be disposed beside the first conductor 127-1 of the first metal layer 120-1, but the inventive concept is not limited thereto.

Each of the first power rails 121-1 through 121-*n* may extend in a first horizontal direction (the X-axis direction in the figure) and may transmit a first voltage SV1. Each of the second power rails 123-1 through 123-3 may extend in the first direction (i.e., the X-axis direction) and may transmit a second voltage SV2. The first power rails 121-1 through 121-*n* may be spaced from one another at regular intervals in a second horizontal direction (the Y-axis direction in the figure), but the inventive concept is not limited thereto. The second power rails 123-1 through 123-3 may also be spaced from one another at regular intervals in the second horizontal direction, but the inventive concept is not limited thereto.

The first voltage SV1 may be one of a supply voltage VDD and a ground voltage VSS and the second voltage SV2 may be the other one of the operating voltage VDD and the supply voltage VSS. The supply voltage simply refers to a voltage that is higher than the ground voltage.

Furthermore, in the description above, the term "rail" refers to any strip of conductive material and thus may comprise any conductor of a type commonly referred to as a trace, strap, or wire, etc. The conductive material may be a metal, e.g., Cu, Ag, Au, Al, or W, but the inventive concept is not limited to these examples.

The first conductor 127-1 may be coupled (or connected) to each of the first power rails 121-1 through 121-n at respective ends thereof and may extend in the second direction (the Y-axis direction). The first conductor 127-1 may be formed of a metal, e.g., Cu, Ag, Au, Al, or W, but the inventive concept is not limited to these examples. The first direction (i.e., the X-axis direction) and the second direction (i.e., the Y-axis direction) may be perpendicular to each other. The first power rails 121-1 through 121-n and the second power rails 123-1 through 123-3 may be alternately disposed in the second direction.

If the first metal layer 120 were not to include the first conductor 127-1, as in the case of a conventional metal layer, a large instantaneous voltage drop (IVD) could occur at one end (i.e., the left end in FIG. 2) of each of the first power rails 121-1 through 121-n (i.e., at the side farthest from a power rail 191 of an upper metal layer Mi (where i=2~6)). In this case, the logic gates 125-1 through 125-5 (especially the logic gates 125-1, 15-3 and 125-5) would be prone to malfunctioning. However, according to this example of the inventive concept, the first conductor 127-1 is coupled (or connected) to the first power rails 121-1 through 121-n at respective ends thereof. Accordingly, a semiconductor device according to the inventive concept as described above may not be subject to the problem posed by an IVD in conventional semiconductor devices having power rails.

As the notation made clear, the upper metal layer Mi referred to above and including power rail 193 (a third power rail) may be any one of the second through sixth metal layers 130 through 170. Preferably, the upper metal layer Mi is the third metal layer 140 or the fifth metal layer 160. In any case, the upper metal layer Mi may include the third power rail 191 for supplying the first voltage SV1 and a fourth power rail 193 for supplying the second voltage SV2. Each of the third and fourth power rails 191 and 193 may extend in the second direction (i.e., the Y-axis direction). Note, in the example of FIG. 2, for the sake of simplicity, only the third and fourth power rails 191 and 193 of the upper metal layer Mi, and only the first and second power rails 121-1 through 121-n and 123-1 through 123-3 and the first conductor 127-1 of the first metal layer 120 are shown.

The first power rails 121-1 through 121-n may be connected with the third power rail 191 through vias VIAVD. In the example in which the third power rail 191 constitutes the third metal layer 140, the vias VIAVD may include plural sets of vertically aligned vias (four sets in the illustrated example) each set including one of the vias VIA2 and one of the vias VIA1. The second power rails 123-1 through 123-3 may be connected with the fourth power rail 193 through vias VIAVS. Likewise, in the example in which the forth power rail 193 constitutes the third metal layer 140, the vias VIAVD may include plural sets of vertically aligned vias (three sets in the illustrated example) each set also including one of the vias VIA2 and one of the vias VIA1.

In some examples, a plurality of metal (vertical) contacts 129-1 through 129-10 may be connected to the first metal layer 120. The first logic gate 125-1 may be connected with the power rails 121-1 and 123-1 through the metal contacts 129-1 and 129-2. The second logic gate 125-2 may be connected with the power rails 123-1 and 121-2 through the metal contacts 129-3 and 129-4. The third logic gate 125-3 may be connected with the power rails 121-2 and 123-3 through the metal contacts 129-5 and 129-6. The fourth logic gate 125-4 may be connected with the power rails 123-2 and 121-3 through the metal contacts 129-7 and 129-8. The fifth logic gate 125-5 may be connected with the power rails 121-3 and 123-3 through the metal contacts 129-9 and 129-10. Thus, a particular logic gate will be supplied with the voltages SV1 and SV2 as operating voltages at the parts of the logic gate connection to respective ones of the first and second power rails.

Figure 3:
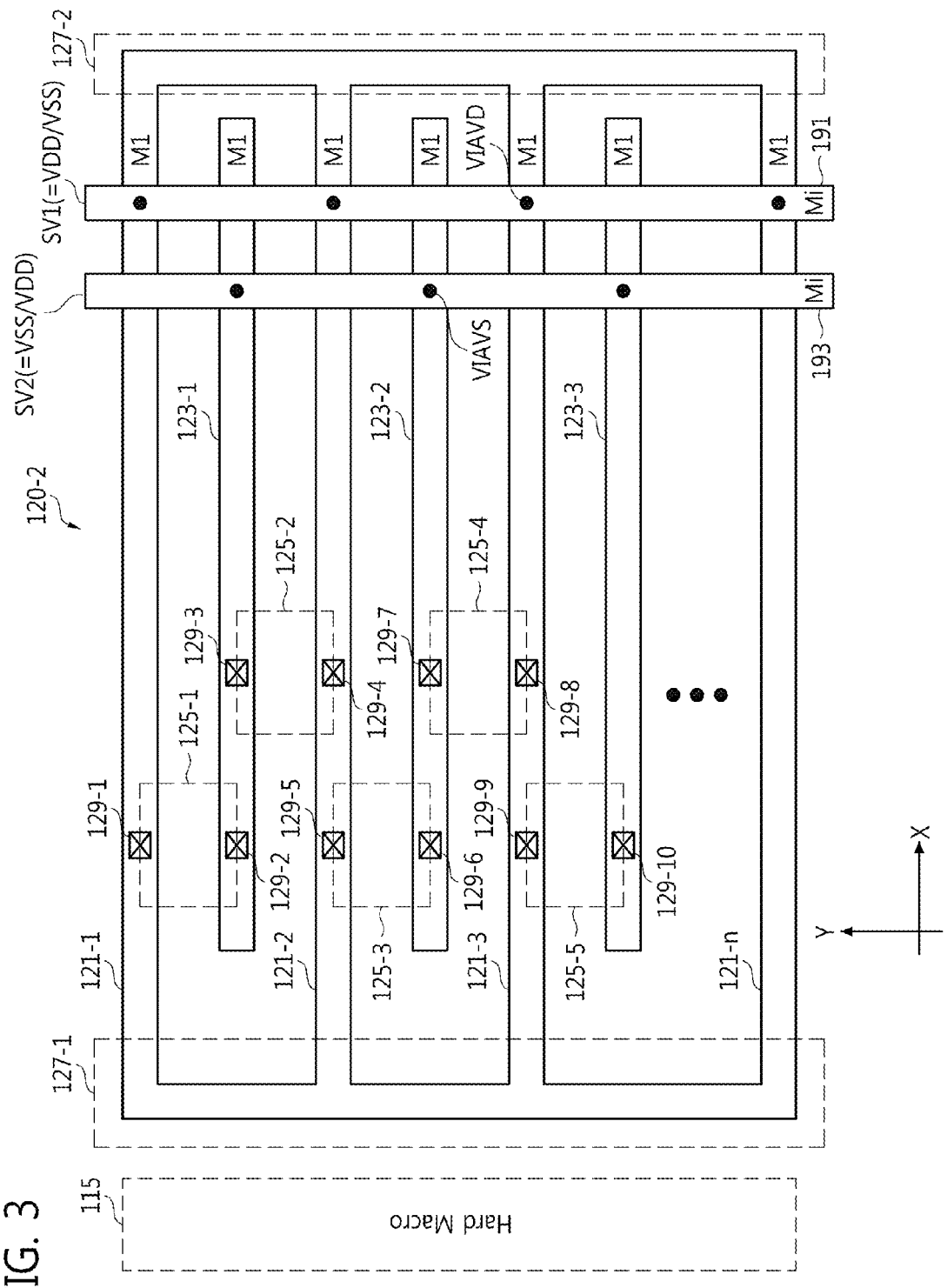
FIG. 3 is a plan view of parts of a first metal layer and an upper metal layer in another example of a semiconductor device of the type illustrated in FIG. 1, according the inventive concept.

FIG. 3 is a plan view (layout diagram of elements) of another example of a semiconductor device according to the inventive concept including that of a first metal layer 120-2. In examples of the inventive concept illustrate by FIGS. 1 and 3, one or more of the metal layers 120 through 160 illustrated in FIG. 1 may have a structure similar to that of the first metal layer 120-2 illustrated in FIG. 3.

The first metal layer 120-2 may include the first power rails 121-1 through 121-n, the second power rails 123-1 through 123-3, the first conductor 127-1, and a second conductor 127-2. The first power rails 121-1 through 121-n, the second power rails 123-1 through 123-3, the first conductor 127-1, and the second conductor 127-2 may thus occupy the same plane. The second conductor 127-2 is coupled to (integral with) the first power rails 121-1 through 121-n at second ends thereof, respectively, and may extend in the second direction. The second conductor 127-2 may be formed of metal, e.g., Cu, Ag, Au, Al, or W, but the inventive concept is not limited to these examples. Note, in the example of FIG. 3, for the sake of simplicity, only the third and fourth power rails 191 and 193 of the upper metal layer Mi, and only the first and second power rails 121-1 through 121-n and 123-1 through 123-3 and the first and second conductors 127-1 and 127-2 of the first metal layer 120 are shown.

In other examples of semiconductor devices according to the inventive concept, one or more of the metal interconnections, e.g., the first metal interconnection M1, may include the first conductor 127-1 electrically connecting the first power rails 121-1 through 121-n at first ends thereof, as in the example illustrated in FIG. 2, and a conductor electrically connecting the second power rails 123-1 through 123-3 at first ends thereof (remote from the power rails 191, 193 as viewed in plan). In still other examples of semiconductor devices according to the inventive concept, one or more of the metal interconnections, e.g., the first metal interconnection M1, may include the first conductor 127-1 and the second conductor 127-2 electrically connecting the first power rails 121-1 through 121-n at first and second ends thereof, respectively, as in the example illustrated in FIG. 3, and a conductor electrically connecting the second power rails 123-1 through 123-3 at first ends thereof (remote from the power rails 191, 193 as viewed in plan).

Figure 4:
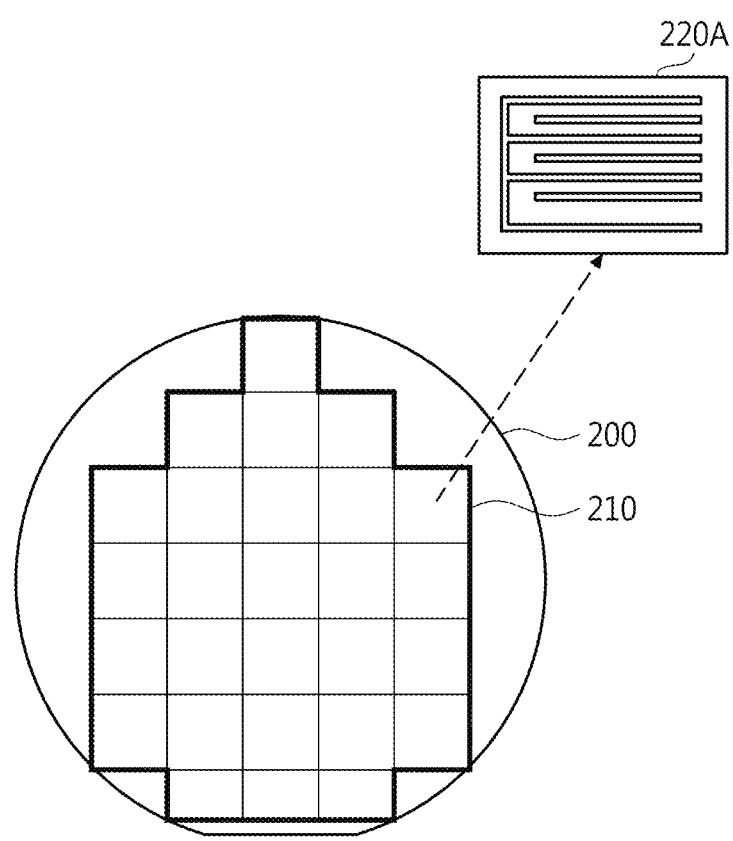
FIG. 4 is a conceptual diagram of a procedure for forming one example of a metal layer using a mask according the inventive concept.

FIG. 4 illustrates a procedure for forming a metal layer using a mask 220A according to the inventive concept. Referring to FIGS. 1, 2, and 4, a semiconductor wafer 200 may include a plurality of chips 210. When a particular metal layer is formed in each of the chips 210, the first power rails 121-1 through 121-n, the second power rails 123-1 through 123-3, and the first conductor 127-1 may be formed simultaneously in each chip as part of the metal layer using one mask 220A.

Figure 5:
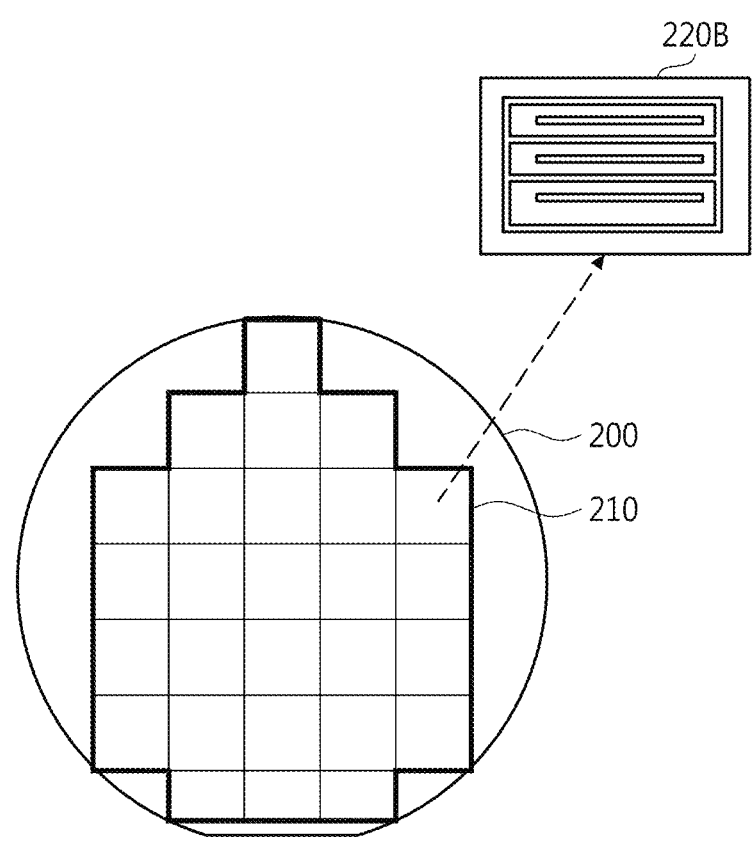
FIG. 5 is a conceptual diagram of a procedure for forming another example of a metal layer using a mask according to the inventive concept.

FIG. 5 illustrates a procedure for forming a metal layer using a mask 220B according to the inventive concept. Referring to FIGS. 1, 3, and 5, the semiconductor wafer 200 may include the chips 210. When a particular metal layer is formed in each of the chips 210, the first power rails 121-1 through 121-n, the second power rails 123-1 through 123-3, the first conductor 127-1, and the second conductor 127-2 may be formed simultaneously in each chip as part of the metal layer using one mask 220B.

Figure 6:
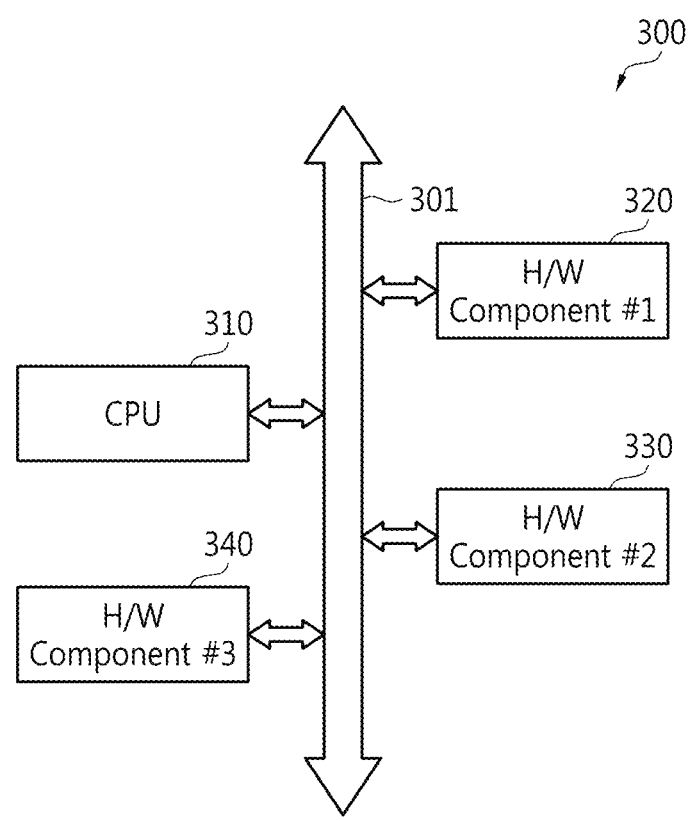
FIG. 6 is a block diagram of an example of an electronic system including a semiconductor device according to the inventive concept.

FIG. 6 illustrates a semiconductor system 300 including a semiconductor device according the inventive concept Referring to FIGS. 1 through 6, the semiconductor system 300 may include a bus 301, a CPU 310, and a plurality of hardware (H/W) components 320, 330, and 340. At least one of the H/W components 320, 330, and 340 may be constituted by a semiconductor device according to the inventive concept, such as any of the examples of the semiconductor devices described with reference to FIGS. 1 through 3.

For example, at least one of the H/W components 320, 330, and 340 may include the semiconductor substrate 110 and the metal layers 120 through 170 formed on or above the semiconductor substrate 110. One of the metal layers 120 through 170 may include the first power rails 121-1 through 121-n which extend in a first direction and provide the first voltage SV1, the second power rails 123-1 through 123-3 which extend in the first direction and provide the second voltage SV2, and the first conductor 127-1 which is coupled to (integral with) a first end of each of the first power rails 121-1 through 121-n and extends in a second direction.

In another example, the at least one of the H/W components 320, 330, and 340 may also include the second conductor 127-2 which is coupled to (integral with) the second end of each of the first power rails 121-1 through 121-n and extends in the second direction.

Thus, the semiconductor system 300 may be embodied as a system on chip (SoC).

Figure 7:
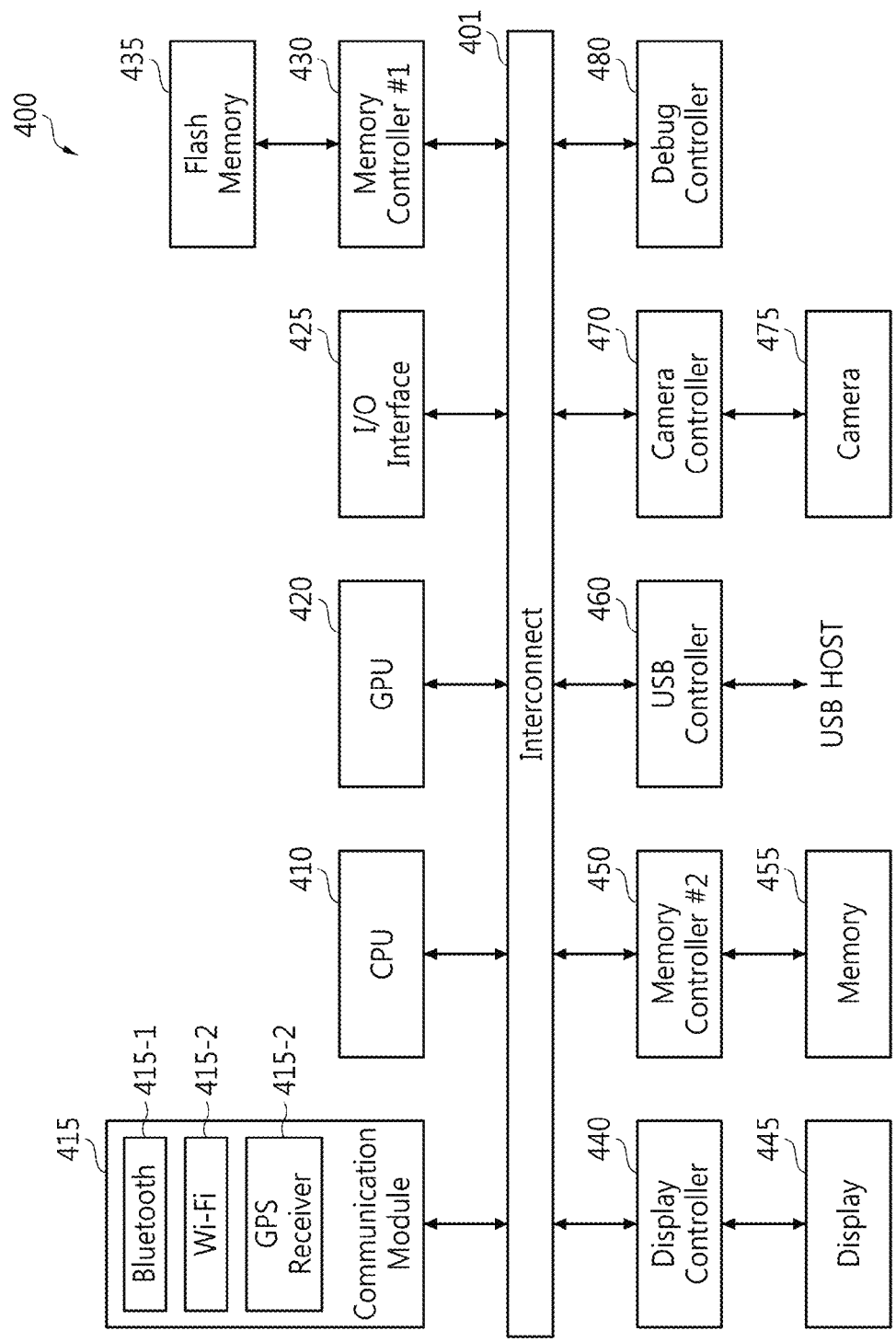
FIG. 7 is a block diagram of another example of an electronic system including a semiconductor device according to the inventive concept.

FIG. 7 also illustrates an example of a semiconductor system 400 including a semiconductor device according to the inventive concept.

The semiconductor system 400 may include an interconnect 401, a plurality of H/W components 410, 415, 420, 425, 430, 440, 450, 460, 470, and 480, a first memory 435, a display 445, a second memory 455, and a camera 475.

The semiconductor system 400 may constitute an operating system of a desktop personal computer (PC) or a mobile device such as a laptop computer, a cellular phone, a smartphone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an internet of things (IoT) device, an internet of everything (IoE) device, a drone, or an e-book.

The interconnect 401 and the H/W components 410, 415, 420, 425, 430, 440, 450, 460, 470, and 480 may be provided by an SoC, a group of chips, or a semiconductor package. The semiconductor package may be a system-in-package (SiP) or a multichip package (MCP) but is not limited thereto.

At least one of the H/W components 410, 415, 420, 425, 430, 440, 450, 460, 470, and 480 may include the semiconductor substrate 110 and the metal layers 120 through 170 formed on or above the semiconductor substrate 110. One of the metal layers 120 through 170 may include the first power rails 121-1 through 121-n which extend in a first direction and transmit the first voltage SV1, the second power rails 123-1 through 123-3 which extend in the first direction and transmit the second voltage SV2, and the first conductor 127-1 which is coupled to one end of each of the first power rails 121-1 through 121-n and extends in a second direction.

As shown in FIG. 3, the at least one of the H/W components 410, 415, 420, 425, 430, 440, 450, 460, 470, and 480 may also include the second conductor 127-2 which is coupled to another end of each of the first power rails 121-1 through 121-n and extends in the second direction.

The first H/W component 320 illustrated in FIG. 6 may be one of the H/W components 410, 415, 420, 425, 430, 440, 450, 460, 470, and 480. The second H/W component 330 may be another one of the H/W components 410, 415, 420, 425, 430, 440, 450, 460, 470, and 480. The third H/W component 340 may be still another one of the H/W components 410, 415, 420, 425, 430, 440, 450, 460, 470, and 480.

The CPU 410 may control the operations of the H/W components 410, 415, 420, 425, 430, 440, 450, 460, 470, and 480 through the interconnect 401. For example, the interconnect 401 may be implemented as a bus.

The communication module 415 may control data transferred between an external communication device and the semiconductor system 400. The communication module 415 may include a transceiver 415-1 for Bluetooth communication, a transceiver 415-2 for Wi-Fi communication, and a global positioning system (GPS) receiver 415-3 receiving GPS signals. Data processed by the communication module 415 may be transmitted to at least one of the H/W components 410, 420, 425, 430, 440, 450, 460, 470, and 480 through the interconnect 401. The graphics processing unit (GPU) 420 may process graphics data.

The input/output (I/O) interface 425 may transmit data input by a user to the interconnect 401 or transmit data from the interconnect 401 to an I/O device. The first memory controller 430 may write data to the first memory 435 or read data from the first memory 435 according to the control of the CPU 410 or the GPU 420. The first memory 435 may be a non-volatile memory.

The display controller 440 may control the operation of the display 445 according to the control of the CPU 410 or the GPU 420. The display controller 440 may transmit display data to the display 445.

The second memory controller 450 may write data to the second memory 455 or read data from the second memory 455 according to the control of the CPU 410 or the GPU 420. The second memory 455 may be a volatile memory.

The USB controller 460 may communicate data with a USB host. The camera controller 470 may process data output from the camera 475 and transmit the processed data to the interconnect 401. The debug controller 480 may control debugging of the semiconductor system 400.

As described above, a semiconductor device according to the inventive concept does not require a routing resource, i.e., a power rail on an upper metal layer to supply power to a lower metal layer. Thus, a semiconductor device according to the inventive concept can help minimize the size of a chip comprising the same. In addition, a semiconductor device according to the inventive concept minimizes instantaneous voltage drops (IVDs) and thus mitigates problems, such as the malfunction of active electronic elements, due to IVDs.

Although the inventive concept has been particularly shown and described with reference to various examples thereof, it will be understood by those of ordinary skill in the art that various changes in forms and details may be made to such examples without departing from the spirit and scope of the inventive concept as defined by the following claims.

What is claimed is:

1. A semiconductor device comprising:
a semiconductor substrate; and
a plurality of metal layers disposed one above another on the semiconductor substrate,
wherein each of at least one first metal layer among the metal layers comprises:
a plurality of first power rails dedicated for connection to a first voltage and each of which extend longitudinally in a first direction;
a plurality of second power rails dedicated for connection to a second voltage, different from the first voltage, and each of which extends longitudinally in the first direction; and
a first conductor which is integral exclusively with each of the first power rails, among the first power rails and the second power rails, at first ends of the first power rails, respectively, and spans the first power rails in a second direction.

2. The semiconductor device of claim 1,
wherein each at least one first metal layer further comprises a second conductor which is integral with each first power rails at second ends of the first power rails, respectively, and spans the first power rails in the second direction.

3. The semiconductor device of claim 1,
wherein the first power rails and the first conductor are disposed at the same level in the semiconductor device above the semiconductor substrate.

4. The semiconductor device of claim 1,
wherein the first direction is perpendicular to the second direction.

5. The semiconductor device of claim 1,
wherein the first power rails are alternately disposed with the second power rails in a horizontal direction parallel to an upper surface of the substrate.

6. The semiconductor device of claim 1, further comprising:
a first logic gate disposed at an upper portion of the semiconductor substrate and electrically connected to a first one first power rails and one of the second power rails.

7. The semiconductor device of claim 6, further comprising:
a second logic gate disposed at the upper portion of the semiconductor substrate and electrically connected to the one of the second power rails and a second one first power rails.

8. The semiconductor device of claim 1, further comprising:
a hard macro disposed beside the first conductor.

9. The semiconductor device of claim 1, further comprising:
a plurality of vias including a plurality of first vias and a plurality of second vias,
wherein the plurality of metal layers further comprises a second metal layer disposed above one of the at least one first metal layer and including a third power rail dedicated for connection to the first voltage, and a fourth power rail dedicated for connection to the second voltage,
wherein the plurality of first vias electrically connect the first power rails with the third power rail such that the third power rail provides the first voltage to the first power rails, and
the plurality of second vias electrically connect the second power rails with the fourth power rail such that the fourth power rail provides the second voltage to the second power rails.

10. The semiconductor device of claim 9,
wherein each of the third power rail and the fourth power rail extend in the second direction.

11. The semiconductor device of claim 9,
wherein the plurality of metal layers further comprises at least one third metal layer each interposed between one of the at least one first metal layer and the second metal layer.

12. A semiconductor device comprising:
a semiconductor substrate;
active electronic elements disposed at an upper portion of the semiconductor substrate and arrayed as an array in first and second directions each parallel to an upper surface of the semiconductor substrate;
a plurality of first power rails each of which extends longitudinally in the first direction across the array of active electronic elements;
a plurality of second power rails each of which extends longitudinally in the first direction across the array of active electronic elements;
a first conductor that is exclusively integral with each first power rails among the first power rails and the second power rails, at first ends first power rails, respectively;
a third power rail disposed above first power rails and extending across the first power rails in the second direction; and
a first set of vias electrically connecting the third power rail to the first power rails,
wherein each of the active electronic elements is electrically connected to a respective one first power rails and a respective one of the second power rails.

13. The semiconductor device of claim 12, further comprising:
a second conductor that is integral with each first power rails at second ends first power rails, respectively, and
wherein the third power rail is located in the first direction between the second conductor and the array of active electronic elements.

14. The semiconductor device of claim 12,
wherein the first and second power rails are alternately disposed in the second direction.

15. The semiconductor device of claim 12, wherein the first conductor is contiguous with the first power rails, and
sets first power rails, the second power rails and the first conductor have coplanar upper and lower surfaces and each collectively constitute at least one first metal layer.

16. The semiconductor device of claim 15, further comprising:
at least one second metal layer vertically interposed between the third power rail and the at least one first metal layer.

17. The semiconductor device of claim 12, further comprising:
a fourth power rail disposed above second power rails and extending across the second power rails in the second direction; and
a second set of vias electrically connecting the fourth power rail to the second power rails, and
wherein the array of the active electronic elements is located in the first direction between the third power rail and the first conductor.

18. The semiconductor device of claim 17,
wherein the fourth power rail has upper and lower surfaces coplanar with upper and lower surfaces third power rail.

19. A semiconductor system comprising:
a semiconductor substrate;
active electronic elements disposed at an upper portion of a first region of the semiconductor substrate and arrayed in an array in first and second directions each parallel to an upper surface of the semiconductor substrate;
a hard macro disposed at an upper portion of a second region of the semiconductor substrate;
a plurality of metal layers disposed on the semiconductor substrate at a plurality of different levels each above levels of the active electronic elements and the hard macro;
a first set of vias; and
a second set of vias, and
wherein a first one of the metal layers comprises a plurality of first power rails each of which extends longitudinally in the first direction across the array of active electronic elements, a plurality of second power rails each of which extends longitudinally in the first direction across the array of active electronic elements, and a conductor exclusively integral with each first power rails, among the first power rails and the second power rails, at first ends first power rails, respectively,
a second one of the metal layers is disposed above first one of the metal layers and includes a third power rail extending across the first power rails in the second direction, and a fourth power rail extending across the second power rails in the second direction,
the first set of vias electrically connects the third power rail to the first power rails,
the second set of vias electrically connects the fourth power rail to the second power rails,
the array of the active electronic elements is located in the first direction between the third power rail and the conductor, and
each of the active electronic elements is electrically connected to a respective one first power rails and a respective one of the second power rails.

20. The semiconductor device of claim 19,
wherein the active electronic elements comprise logic gates, and parts of each of the logic gates at which the logic gate is electrically connected to respective ones of the first and second power rails are aligned in the second direction.

* * * * *